(12) United States Patent
Liu et al.

(10) Patent No.: US 11,145,782 B2
(45) Date of Patent: Oct. 12, 2021

(54) PROCESSING AN OPTICAL DEVICE

(71) Applicant: TEXAS INSTRUMENTS INCORPORATED, Dallas, TX (US)

(72) Inventors: Jane Qian Liu, Plano, TX (US); Gary Philip Thomson, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/233,770

(22) Filed: Dec. 27, 2018

(65) Prior Publication Data

US 2020/0212250 A1    Jul. 2, 2020

(51) Int. Cl.
| | | |
|---|---|---|
| *H01L 31/18* | (2006.01) | |
| *H01L 31/0203* | (2014.01) | |
| *H01L 31/02* | (2006.01) | |
| *H01L 33/48* | (2010.01) | |
| *H01L 33/54* | (2010.01) | |
| *H01L 33/00* | (2010.01) | |
| *H01L 23/544* | (2006.01) | |
| *H01L 33/62* | (2010.01) | |

(52) U.S. Cl.
CPC ........ *H01L 31/1876* (2013.01); *H01L 23/544* (2013.01); *H01L 31/0203* (2013.01); *H01L 31/02005* (2013.01); *H01L 33/005* (2013.01); *H01L 33/483* (2013.01); *H01L 33/54* (2013.01); *H01L 33/62* (2013.01); *H01L 2223/5446* (2013.01); *H01L 2933/005* (2013.01); *H01L 2933/0033* (2013.01); *H01L 2933/0066* (2013.01)

(58) Field of Classification Search
CPC . H01L 31/0203; H01L 33/005; H01L 33/483; H01L 33/54; H01L 33/62; H01L 2223/5446; H01L 2933/0033; H01L 2933/005; H01L 2933/0066; H01L 27/14–14893; H01L 31/1876; H01L 31/02005; H01L 23/544; H01L 2224/48091; H01L 21/561; H01L 23/2931; H01L 23/312
See application file for complete search history.

(56) References Cited

U.S. PATENT DOCUMENTS

| | | |
|---|---|---|
| 7,447,404 B2 | 11/2008 | Miller |
| 8,280,255 B2 | 10/2012 | Joyner et al. |
| 8,542,958 B2 | 9/2013 | Joyner et al. |
| 2002/0056560 A1* | 5/2002 | Liu ................. B81B 7/0067 174/50.5 |
| 2004/0113283 A1* | 6/2004 | Farnworth .......... H01L 21/6835 257/782 |
| 2014/0233086 A1* | 8/2014 | Oberst ................. B81B 7/007 359/291 |

(Continued)

*Primary Examiner* — Shahed Ahmed
(74) *Attorney, Agent, or Firm* — Michelle F. Murray; Charles A. Brill; Frank D. Cimino

(57) ABSTRACT

A method for processing an integrated optical circuit chip includes securing a panel dam around a periphery of an array of integrated optical circuit chips that share a substrate. The method also includes filling an area circumscribed by the panel dam with an insulating polymer to a level below a top surface of the integrated optical circuit chips. The method further includes singulating a given integrated optical circuit chip in the array of integrated optical circuit chips.

20 Claims, 4 Drawing Sheets

(56) References Cited

U.S. PATENT DOCUMENTS

| | | | |
|---|---|---|---|
| 2014/0339668 A1* | 11/2014 | Arima | H01L 27/14601 |
| | | | 257/443 |
| 2017/0168234 A1 | 6/2017 | Shi et al. | |
| 2017/0194308 A1 | 7/2017 | Evans et al. | |
| 2018/0172935 A1 | 6/2018 | Collins | |
| 2019/0144270 A1* | 5/2019 | Liu | B81B 7/0067 |
| | | | 359/513 |
| 2019/0295858 A1* | 9/2019 | Athavale | H01L 24/20 |

* cited by examiner

PROCESSING AN OPTICAL DEVICE

TECHNICAL FIELD

This disclosure relates to optical devices, and more particularly, to systems and methods for processing an integrated optical circuit chip.

BACKGROUND

Optical electronic devices, or simply, optical devices, include electronic devices and systems that source, detect and control light. In this context, light includes invisible forms of radiation such as gamma rays, X-rays, ultraviolet and infrared, in addition to visible light. Optical devices include electrical-to-optical or optical-to-electrical transducers, or instruments that use such devices in operation.

An integrated optical circuit chip, also referred to as a photonic integrated circuit (PIC) is a device that integrates multiple (at least two) photonic functions and as such is similar to an electronic integrated circuit chip. The integrated optical circuit chip provides functions for information signals imposed on optical wavelengths such as wavelengths in the visible spectrum or wavelengths outside the visible spectrum.

SUMMARY

One example relates to a method for processing an integrated optical circuit chip. The method includes securing a panel dam around a periphery of an array of integrated optical circuit chips that share a substrate. The method also includes filling an area circumscribed by the panel dam with an insulating polymer to a level below a top surface of the integrated optical circuit chips. The method further includes singulating a given integrated optical circuit chip in the array of integrated optical circuit chips.

Another example relates to a method for processing an integrated optical circuit chip. The method includes forming a panel dam around a periphery of an array of integrated optical circuit chips. The integrated optical circuit chips include an optical aperture on a top side of a respective integrated optical circuit chip. The method also includes filling an area circumscribed by the panel dam with an insulating polymer to a level below a top edge of the integrated optical circuit chips of the array of integrated optical circuit chips. The insulating polymer covers four sides of the integrated optical circuit chips of the array of integrated optical circuit chips. The method yet further includes singulating a given integrated optical circuit chip in the array of integrated optical circuit chips.

Yet another example relates to an integrated optical circuit chip that includes a die. An optical aperture positioned on a given side of the integrated optical circuit chip exposes an optical circuit in the die to an environment. The integrated optical circuit also includes a substrate having a plurality of conductive pads. The plurality of conductive pads is connected to the die through a corresponding wire bond of a plurality of wire bonds. The integrated optical circuit chip further includes an insulating polymer covering four sides of the die and the substrate.

DETAILED DESCRIPTION

Examples of systems and methods for processing an array of integrated optical circuit chips are described. The processing includes securing a panel dam around a periphery of the array of integrated optical circuit chips. Each integrated optical circuit chip in the array includes an optical aperture on a top side a respective integrated optical circuit chip. Upon securing the panel dam, the area circumscribed by the panel dam is filled with an insulating polymer (e.g., an epoxy or silicone). The insulating polymer flows between the integrated optical circuit chips up to a level below a top edge of each integrated optical circuit chip of the array. In this manner, the insulating polymer covers four sides of each integrated optical circuit chip of the array of integrated optical circuit chips.

Upon filing the area circumscribed by the panel dam, the insulating polymer is heated. In some examples, the insulating polymer is heated to a level to form a skin over material state. In other examples, the insulating polymer is heated to a level that cures (hardens) the insulating polymer. Upon such heating, the integrated optical circuit chips of the array are singulated (separated) with one of a variety of different techniques, as discussed herein. In this manner, the entire array of integrated optical circuit chips is processed concurrently. That is, the processing techniques described herein avoids the need to apply the insulating polymer on each integrated optical chip individually. Additionally, as discussed herein, the insulating polymer covers four (4) sides of each integrated optical circuit chip, such that light leakage is curtailed.

Figure 1:
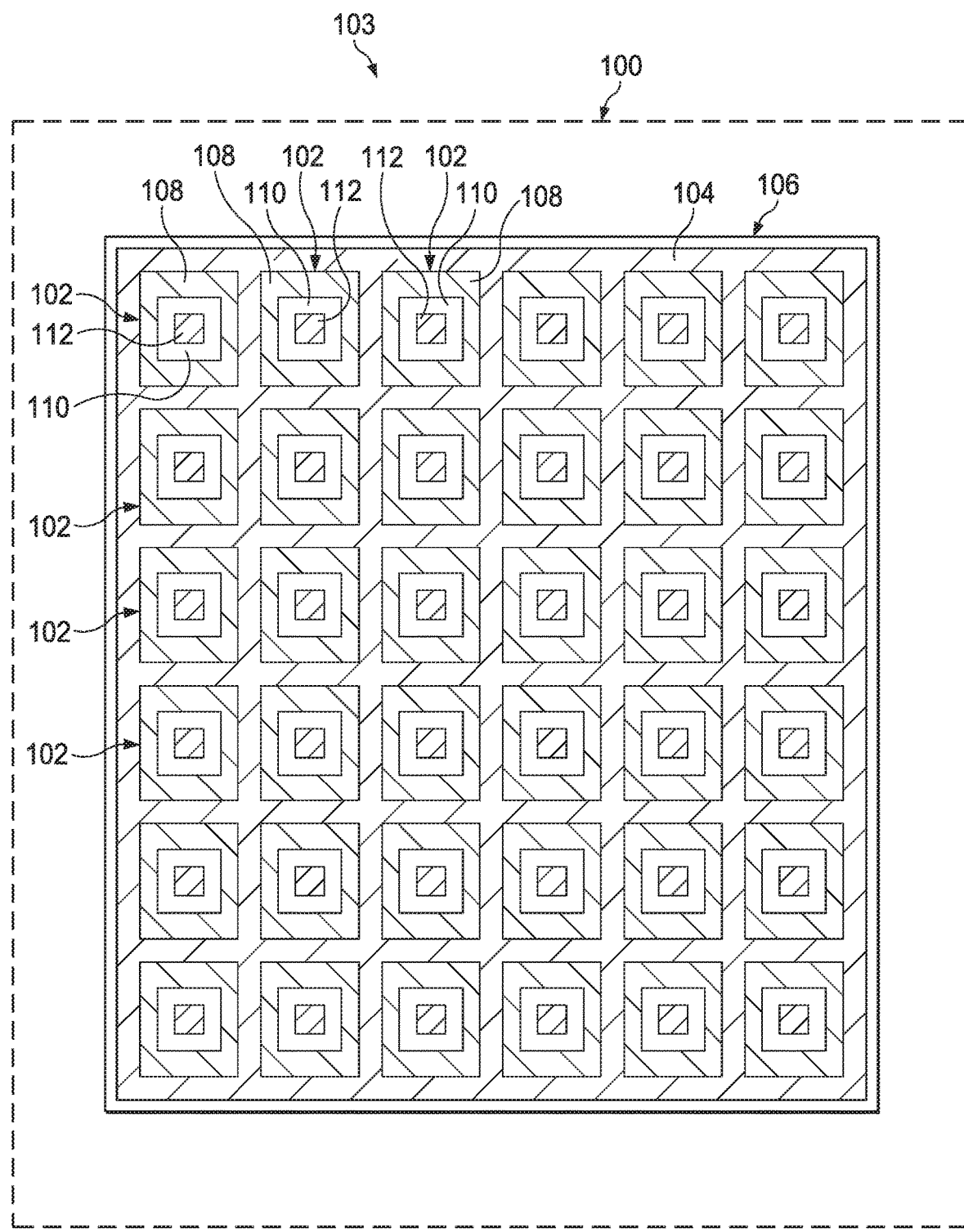
FIG. 1 illustrates a diagram of a system in a first stage of processing an array of integrated optical circuit chips.

FIG. 1 illustrates a diagram of an example of a system 100 for processing an array of integrated optical circuit chips 102, only some of which are labeled. FIG. 1 illustrates a first stage 103 of the process. The array of integrated optical circuit chips 102 are formed of N×M number of integrated optical circuit chips 102, where N and M are integers greater than or equal to one. Moreover, although there are thirty-six (36) integrated optical circuit chips 102 in the example illustrated in FIG. 1, in other examples, there can be more or less integrated optical circuit chips 102 in the array of integrated optical circuit chips 102.

The array of integrated optical circuit chips 102 are formed on a substrate 104 shared by each of the integrated optical circuit chips 102. In one example, the substrate 104 is formed of ceramic. In other examples, the substrate 104 is formed of silicon or other insulating material.

A panel dam 106 is secured around a periphery of the array of integrated optical circuit chips 102. As used herein, the term "panel dam" refers to a physical barrier for the array of integrated optical circuit chips 102 that prevents flow of material across the physical barrier. In some examples, the panel dam 106 is formed of an insulating polymer, such as an epoxy or silicone. As one example, the panel dam 106 is a rectangular frame. To secure the integrated optical circuit chips 102 in the panel dam 106, the panel dam 106 is positioned around a periphery of the substrate 104. In some examples, the panel dam 106 is formed around the substrate 104 of the array of integrated optical circuit chips 102. In such an example, material forming the panel dam 106 is deposited over time in multiple layers. In other examples, the panel dam 106 is pre-formed, and the array of integrated optical circuit chips 102 is positioned (e.g., with a downward force) in to the panel dam 106. That is, in such examples, the panel dam 106 is formed prior to positioning the array of integrated optical circuit chips 102 in an area circumscribed by the panel dam 106.

Each integrated optical circuit chip 102 includes a die 108 and an optical aperture 110 (a window) overlaying the die 108 (only some of which are labeled). The die 108 includes an optical circuit 112 embedded therein. As used herein, the term "optical aperture" refers to both an opening in the die 108 and a layer of transparent or translucent material overlying the opening, through which light travels. Moreover, the optical aperture 110 is formed of a transparent or translucent material, such as a polymer glass, fused silica, quartz, etc. In some examples, the material forming the optical aperture 110 has a rectangular prism shape. Thus, the optical aperture 110 forms a top surface of each integrated optical circuit chip 102. The optical aperture 110 exposes the optical circuit 112 to the surrounding environment. That is, the optical aperture 110 exposes the optical circuit 112 to ambient light. In some examples, the optical circuit 112 is implemented as an array of pixels for a display. In other examples, the optical circuit 112 is implemented as a photo-sensitive circuit, such as a photodetector. In yet other examples, the optical circuit 112 outputs light (e.g., for a display) and implements a photo-sensitive circuit.

Upon securing the array of optical integrated circuits in the panel dam 106, an insulating polymer (not illustrated in FIG. 1) is deposited in the area circumscribed by the panel dam 106 to flow between the integrated optical circuit chips 102. In some examples, the insulating polymer is deposited overhead through a nozzle. In other examples, the insulating polymer is deposited into a port affixed to a sidewall of the panel dam 106.

Figure 2:
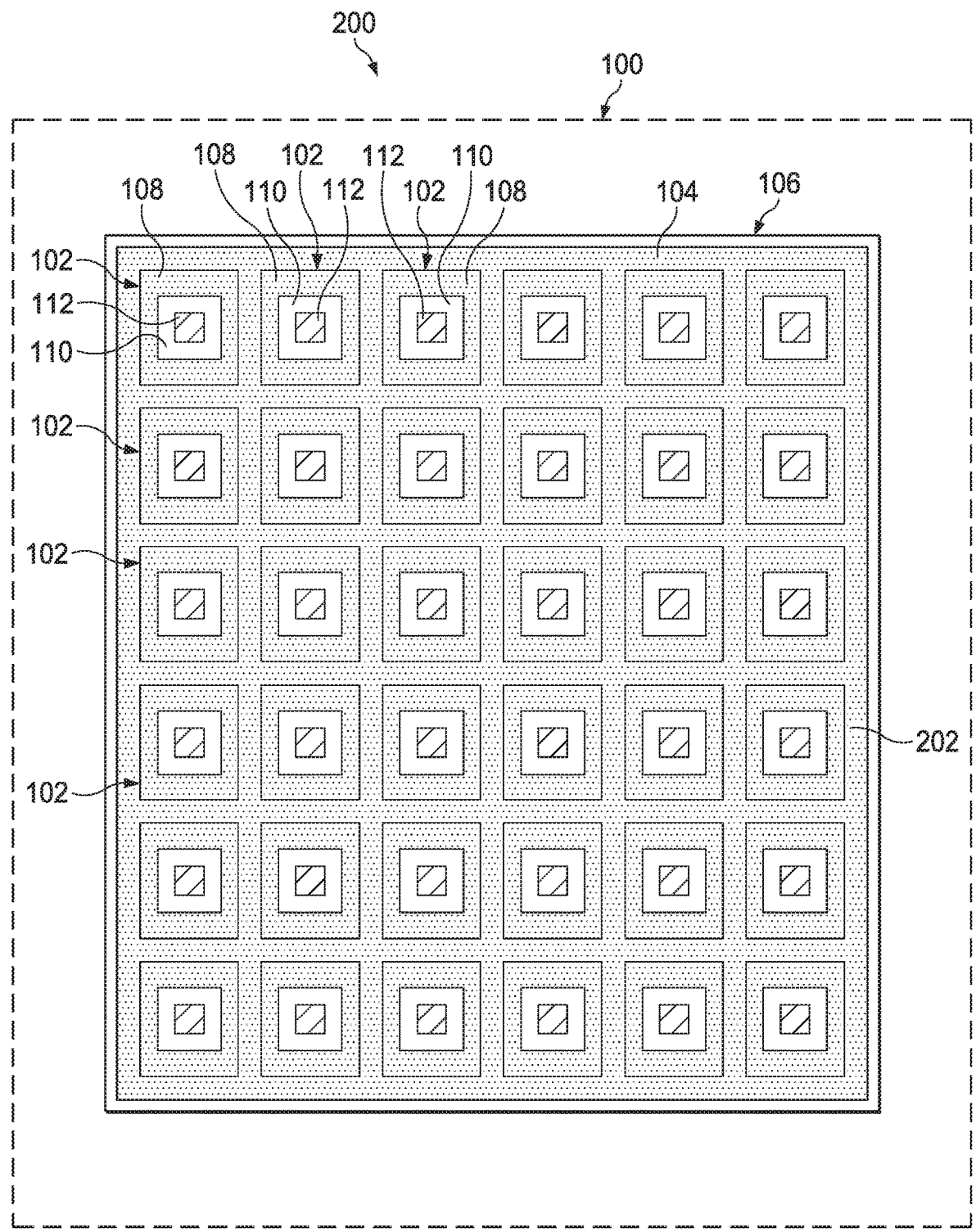
FIG. 2 illustrates a diagram of the system of FIG. 1 in a second stage of processing the array of integrated optical circuit chips.

Depositing the insulating polymer causes the system 100 to transition from the first stage 103 illustrated in FIG. 1 to a second stage 200 illustrated in FIG. 2. For purposes of simplification of explanation, the same reference numbers are employed in FIGS. 1 and 2 to denote the same structure.

In the second stage 200, the insulating polymer 202 has been deposited in the area circumscribed by the panel dam 106. In some examples, the insulating polymer 202 is implemented as an epoxy. In other examples, the insulating polymer 202 is implemented with silicone. In some examples, the insulating polymer 202 selected has a relatively high rate of flow to allow the insulating material to flow between each of the integrated optical circuit chips 102.

In some examples, the insulating polymer 202 fills the area circumscribed by the panel dam 106 to a level near (e.g., within about 3 millimeters) an edge of the top surface of each integrated optical circuit chip 102, which corresponds to a top edge of the optical aperture 110. That is, the insulating polymer 202 is filled to a level that leaves the optical circuit 112 exposed to the environment through the optical aperture 110. Alternatively, in some examples, the insulating polymer 202 is filled to a level covering wire bods of the IC chip 102.

Upon flowing the insulating polymer 202 throughout the area circumscribed by the panel dam 106, in some examples, the insulating polymer 202 is heated. In one example, to heat the insulating polymer 202, the entire system 100 is baked/heated in an oven. In some examples, heating of the insulating polymer 202 transitions the insulating polymer 202 from a liquid state to a skin (outer surface) over material state. That is, the heating causes the insulating polymer 202 to partially harden, forming a "skin" on the outer surface of the insulating polymer 202 and the remaining interior of the insulating polymer 202 remains in the liquid state. In other examples, heating of the insulating polymer 202 cures the insulating polymer 202 thereby causing the insulating polymer 202 to transition from the liquid state to a solid state.

Figure 3:
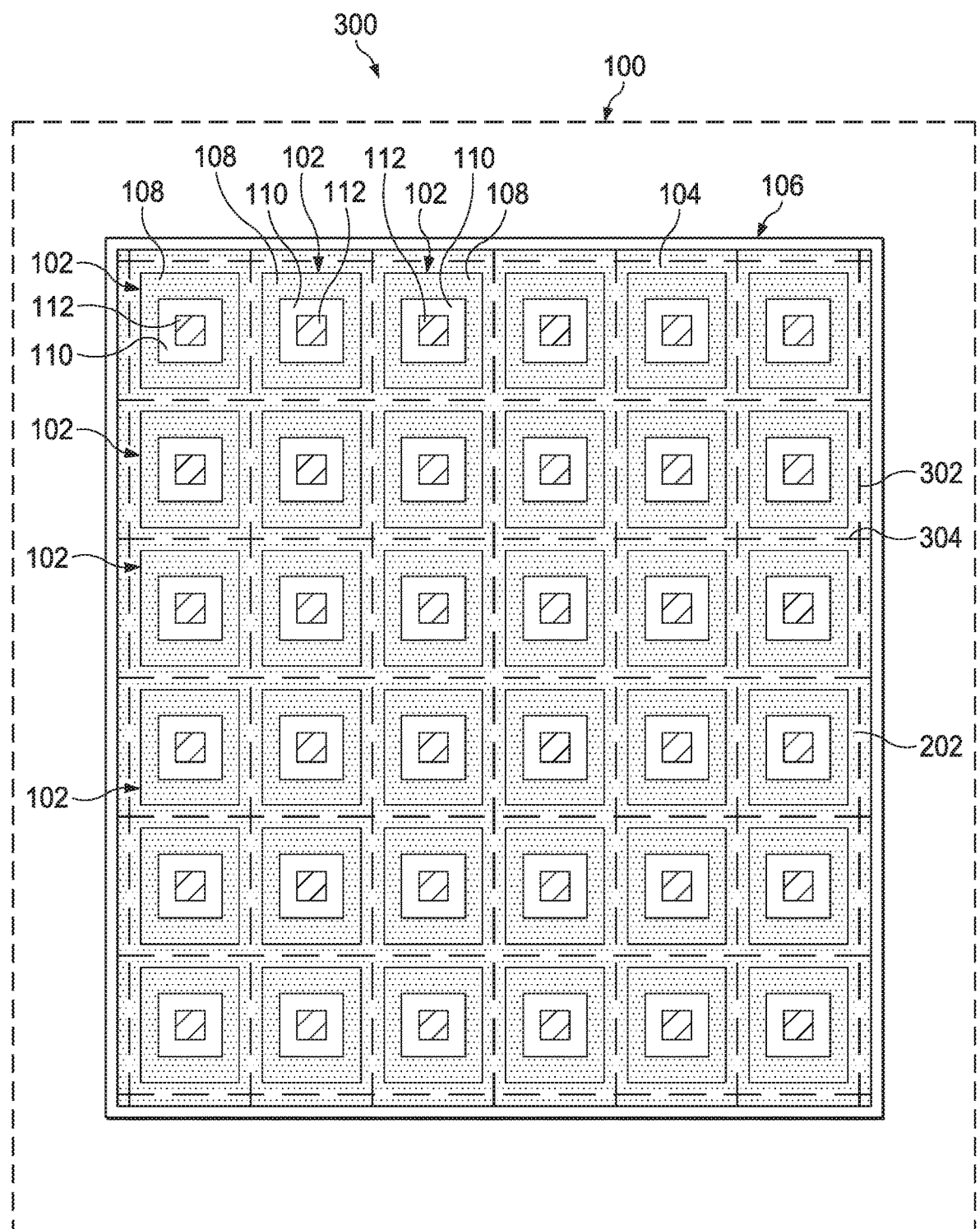
FIG. 3 illustrates a diagram of the system of FIG. 1 in a third stage of processing the array of integrated optical circuit chips.

Heating the insulating polymer 202 transitions the system 100 from the second stage 200 illustrated in FIG. 2 to a third stage 300 illustrated in FIG. 3. For purposes of simplification of explanation, the same reference numbers are employed in FIGS. 1-3 to denote the same structure.

In the third stage 300, each of the N×M number of integrated optical circuit chips 102 are singulated in a singulation process. As used herein, the term "singulated" (and its derivatives) refers to the process of dicing (e.g., cut in a specific way) the array of integrated optical circuit chips 102, such that each integrated optical circuit chips 102 is physically detached. FIG. 3 includes vertical guidelines 302 and horizontal guidelines 304 that provide examples of lines to cut during the singulation process. Each of the vertical guidelines 302 and the horizontal guidelines 304 is positioned on a border of two (2) integrated optical circuit chips 102.

In a first example of the singulation process (hereinafter, "the first example"), the insulating polymer 202 is etched away in an area corresponding to the vertical guidelines 302 and the horizontal guidelines 304. That is, the insulating polymer 202 is etched near (e.g., within about 3 millimeters) a periphery of each of the integrated optical circuit chips 102. As an example, the insulating polymer 202 is etched with a lasing process, a sawing process or a chemical process. Additionally, in examples where the substrate 104 (underlying the insulating polymer 202) is formed of ceramic, scribe lines is formed along the vertical guidelines 302 and the horizontal guidelines 304 with a laser or saw. Each scribed line is formed near (e.g., within about 3 millimeters) the periphery of each integrated optical circuit chips 102. Accordingly, each scribe line is formed on borders between two (2) integrated optical circuit chips 102 or between an integrated optical circuit chip and the panel dam 106.

Continuing with the first example, the singulation of the integrated optical circuit chips 102 includes breaking the scribe lines formed along the vertical guidelines 302 and the horizontal guidelines 304. To break the scribe lines, a force normal to a surface of the array of integrated optical circuit chips 102 is applied. That is in the first example, a downward or upward force applied to a surface of the array of integrated optical circuit chips 102 causes the scribe lines to break, thereby singulating each integrated optical circuit chip 102.

In a second example of the singulation process (hereinafter, "the second example"), a material including the insulating polymer 202 and the substrate 104 areas corresponding to the vertical guidelines 302 and the horizontal guidelines 304 are removed in a sawing or lasing process. That is, the sawing or lasing penetrates through the insulating polymer 202 and the substrate 104 of the array of integrated optical circuit chips 102 and continues near (e.g., within about 3 millimeters) a periphery of the integrated optical circuit chips 102 in the array of integrated optical circuit chips 102. Accordingly, in the second example, a saw or laser cuts through both the insulating polymer 202 and the substrate 104.

By employment of the first, second and third processing stages 103, 200 and 300 on the system 100, the array of integrated optical circuit chips 102 are processed currently. More specifically, by filling the area circumscribed by the panel dam 106 with the insulating polymer 202, the insulating polymer 202 is evenly applied to each of the integrated optical circuit chips 102 concurrently. Additionally, the insulating polymer 202 is evenly applied to four (4) sides of each integrated optical circuit chip 102 to curtail optical leakage. Further still, by employing simple singulating techniques, each integrated optical circuit chips 102 is separated from every other integrated optical circuit chip 102 efficiently.

Figure 4:
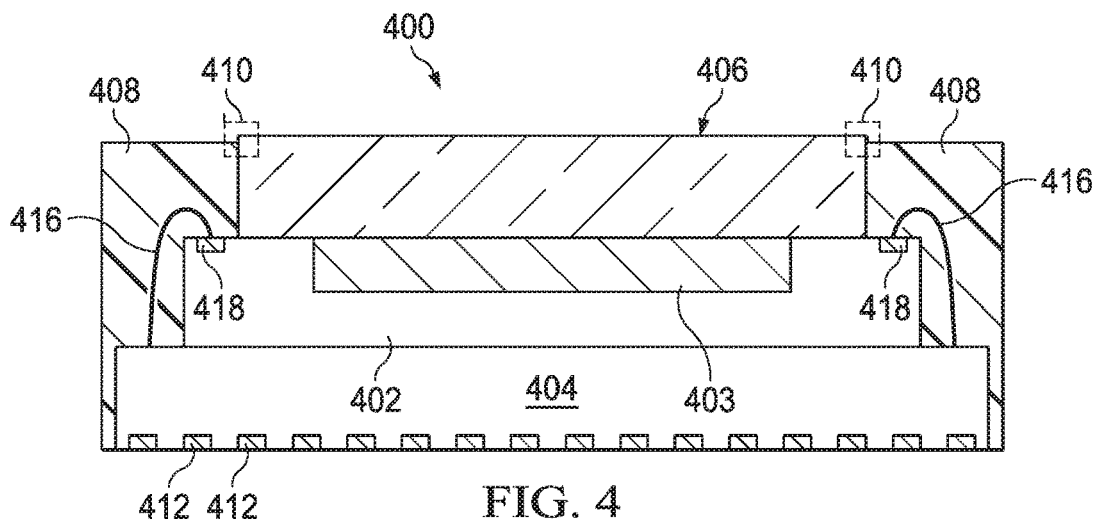
FIG. 4 illustrates a cross-sectional view of an integrated optical circuit chip.

FIG. 4 illustrates a cross-sectional view of an integrated optical circuit chip 400. As one example, the integrated optical circuit chip 400 is formed from the process executed by the system 100 illustrated in FIGS. 1-3. That is, the integrated optical circuit chip 400 corresponds to one of the integrated optical circuit chips 102 illustrated in FIG. 3 (after singulation).

The integrated optical circuit chip 400 includes a die 402 that overlays a substrate 404. The die 402 includes an optical circuit 403 embedded therein. In one example, the substrate 404 is formed of ceramic. In another example, the substrate 404 is formed of a semiconductor, such as silicon. The integrated optical circuit chip 400 includes an optical aperture 406 (a window). The optical aperture 406 includes a transparent or translucent material, such as a polymer glass, fused silica, quartz, etc. that overlays an opening exposing the optical circuit 406. In some examples, the material of the optical aperture 406 has a rectangular prism shape.

The optical circuit 403 embedded in the die 402 is implemented as a light emitting device, a photo-sensitive device or a combination thereof. For instance, in some examples, the optical circuit 403 is implemented as an array of pixels for a display. In other examples, the optical circuit 403 is implemented as a photodetector.

Four (4) sides of the integrated optical circuit chip 400 are covered by (encased in) an insulating polymer 408, such as an epoxy or silicone. In the example illustrated in FIG. 4, two (2) such sides of the integrated optical circuit chip 400 are illustrated, and the remaining two (2) sides are hidden from view.

The optical aperture 406 forms a top surface of each integrated optical circuit chip 102. Thus, the insulating polymer 408 is filled up to a level near (e.g., within 1 millimeter) a top edge 410 of the integrated optical circuit chip 400, which is also the top edge 410 of the optical aperture 406. The optical aperture 406 exposes the optical circuit 403 embedded in the die 402 to a surrounding environment. As noted, the insulating polymer 408 covers four (4) sides of the integrated optical circuit chip 400, including four (4) sides of the optical aperture 406. By covering each of the four (4) sides of the integrated optical circuit chip 400 in this manner, leakage of light traversing the optical aperture 406 is prevented. Conversely, in examples where less than the four (4) sides are covered (e.g., only covering two (2) sides) by the insulating polymer 408, light leakage occurs at the uncovered sides.

In some examples, the substrate 404 is implemented as a lead frame or other chip carrier. The substrate 404 includes a plurality of connection pads 412 (only two of which are labeled) that allow the integrated optical circuit chip 400 to be electrically coupled to a printed wire board or other electronic device. Additionally, the connection pads 412 are conductively coupled to the die 402 through wire bonds 416. The wire bonds 416 are connected to connection leads 418 on the die 402. In the example illustrated, there are two (2) such wire bonds 416, but in other examples, there could be more or less wire bonds 416. In some examples, the wire bonds 416 are positioned on four (4) sides of the integrated optical circuit chip 400. Moreover, although FIG. 4 illustrates the insulating polymer 408 being filled to a level near the top edge 410 of the integrated optical circuit chip 400, in other examples, the insulating polymer 408 is filled to a lower level, such as a level near a top of the wire bond 416.

Figure 5:
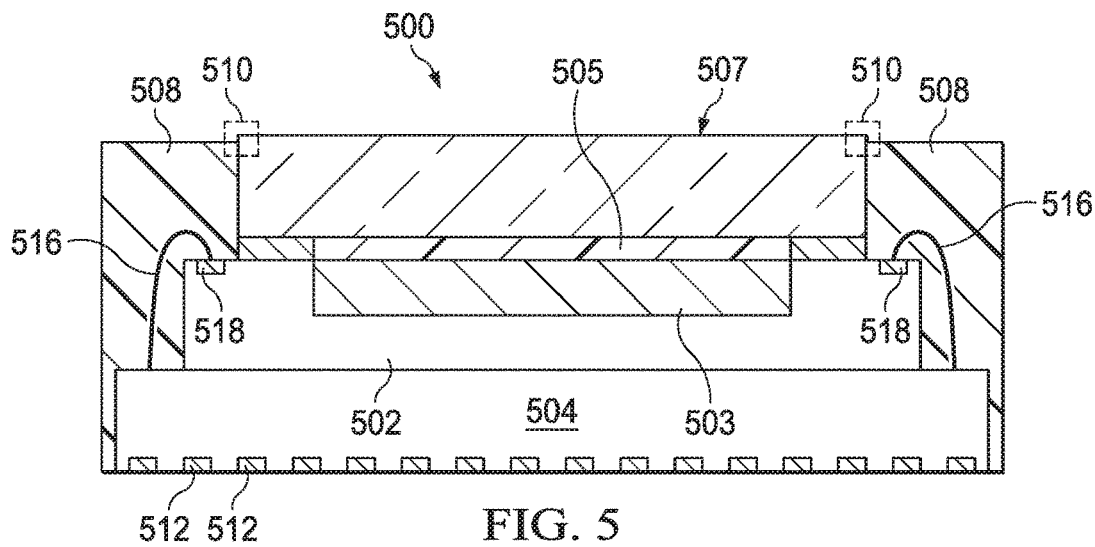
FIG. 5 illustrates a cross-sectional view of another integrated optical circuit chip.

FIG. 5 illustrates cross-sectional view of another integrated optical circuit chip 500. As one example, the integrated optical circuit chips 500 is formed from the process executed by the system 100 illustrated in FIGS. 1-3. That is, the integrated optical circuit chip 500 corresponds to one of the integrated optical circuit chips 102 illustrated in FIG. 3 (after singulation).

The integrated optical circuit chip 500 includes a die 502 that overlays a substrate 504. The die 502 includes an optical circuit 503 embedded therein. In one example, the substrate 504 is formed of ceramic. In another example, the substrate 504 is formed of a semiconductor, such as silicon. The optical circuit 503 embedded in the die 502 is implemented as a light emitting device, a photo-sensitive device or a combination thereof. For instance, in some examples, the optical circuit 503 is implemented as an array of pixels for a display. In other examples, the optical circuit 503 is implemented as a photodetector.

Moreover, in some examples, a mirror array 505 (e.g., a micro-mirror array) overlays the optical circuit 503. In some examples, the mirror array 505 directs light to and/or from the optical circuit. In such examples, a spacer frame 506 circumscribes the mirror array 505 to separate the die 502 from an optical aperture 507 (a window). The optical aperture 507 includes a transparent or translucent material, such as a polymer glass, fused silica, quartz, etc. that overlays an opening exposing the mirror array 505 to direct light to and from the optical circuit 503. In some examples, the material of the optical aperture 507 has a rectangular prism shape.

Four (4) sides of the integrated optical circuit chip 500 are covered by (encased in) an insulating polymer 508, such as an epoxy or silicone. In the example illustrated in FIG. 5, two (2) such sides of the integrated optical circuit chip 500 are illustrated, and the remaining two (2) sides are hidden from view.

The optical aperture 507 forms a top surface of each integrated optical circuit chip 102. Thus, the insulating polymer 508 is filled up to a level near (e.g., within 1 millimeter) a top edge 510 of the integrated optical circuit chip 500, which is also the top edge 510 of the optical aperture 507. The optical aperture 507 exposes the mirror array 505 to a surrounding environment for the direction of light to and from the optical circuit 503. As noted, the insulating polymer 508 covers four (4) sides of the integrated optical circuit chip 500, including four (4) sides of the optical aperture 507. By covering each of the four (4) sides of the integrated optical circuit chip 500 in this manner, leakage of light traversing the optical aperture 507 is prevented. Conversely, in examples where less than the four (4) sides are covered (e.g., only covering two (2) sides) by the insulating polymer 508, light leakage occurs at the uncovered sides.

In some examples, the substrate 504 is implemented as a lead frame or other chip carrier. The substrate 504 includes a plurality of connection pads 512 (only two (2) of which are labeled) that allow the integrated optical circuit chip 500 to be electrically coupled to a printed wire board or other electronic device. Additionally, the connection pads 512 are conductively coupled to the die 502 through wire bonds 516. The wire bonds 516 are connected to connection leads 518 on the die 502. In the example illustrated, there are two (2) such wire bonds 516, but in other examples, there could be more or less wire bonds 516. In some examples, the wire bonds 516 are positioned on four (4) sides of the integrated optical circuit chip 500. Moreover, although FIG. 5 illustrates the insulating polymer 508 being filled to a level near the top edge 510 of the integrated optical circuit chip 500, in other examples, the insulating polymer 508 is filled to a lower level, such as a level near a top of the wire bond 516.

Figure 6:
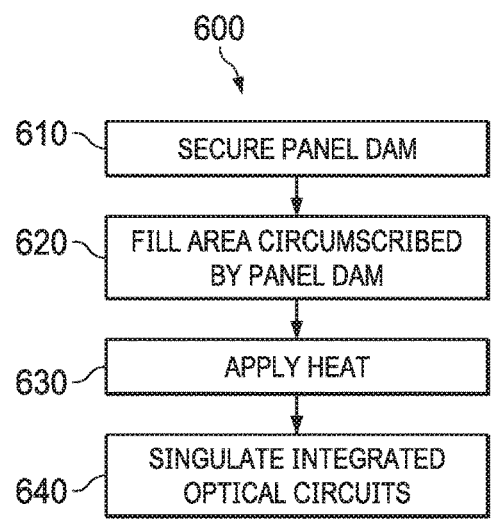
FIG. 6 illustrates a method for processing an array of integrated optical circuit chips.

FIG. 6 illustrates a method 600 for processing an array of integrated optical circuit chips (e.g., the array of integrated optical circuit chips 102 illustrated in FIGS. 1-3 and/or multiple instances of the integrated optical circuit chip 400 of FIG. 4). At 610, a panel dam (e.g., the panel dam 106 of FIG. 1) is secured around a periphery of an array of integrated optical circuit chips. To secure the panel dam, in some examples, the panel dam is formed along the periphery of the array of integrated optical circuit chips. In other examples, a pre-formed panel dam is attached to the periphery of the array of integrated optical circuit chips.

At 620, the area circumscribed by the panel dam is filled with an insulating polymer (e.g., the insulating polymer 202 illustrated in FIG. 2). In some examples, the insulating polymer is implemented as silicone. In other examples, the insulating polymer is implemented as an epoxy. The insulating polymer flows between the integrated optical circuit chips and is filled to a level near a top edge of the integrated optical circuit chips (e.g., the top edge 410 of FIG. 4). At 630, the insulating polymer is heated (e.g., by heating the entire filled panel dam) to form a skin over material coating.

At 640, the integrated optical circuit chips are singulated. In some examples, the singulation include etching away the insulating polymer, forming scribe lines near guidelines (e.g., the vertical and horizontal guidelines 302 and 304 of FIG. 3) in a substrate of the array of integrated optical circuit chips and applying a force to break the scribe lines. In other examples, the singulation includes cutting the insulating polymer and the substrate along the guidelines with a saw or a laser.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method for manufacturing a device, the method comprising:
    securing a panel dam around a periphery of an array of integrated optical circuits, the array of integrated optical circuits on a substrate;
    filling an area circumscribed by the panel dam with an insulating polymer to a level below a surface of the integrated optical circuits;
    etching the insulating polymer, to expose at least a portion of the substrate; and
    forming scribe lines in the at least a portion of the substrate.

2. The method of claim 1, wherein the insulating polymer comprises an epoxy or silicone.

3. The method of claim 1, wherein:
    etching the insulating polymer is performed near a periphery of the integrated optical circuits in the array of integrated optical circuits;
    wherein the scribe lines are formed in a border between two integrated optical circuits in the array of integrated optical circuits or between an integrated optical circuit and the panel dam; and
    the method further comprising applying a force to break the substrate along the scribe lines.

4. The method of claim 3, further comprising heating the insulating polymer, prior to applying the force, to form a skin on an outer surface of the insulating polymer.

5. The method of claim 1, wherein a singulated integrated optical circuit in the array of integrated optical circuits includes:
    a die having an aperture that includes transparent or translucent material on a surface of the die opposite the substrate; and
    wire bonds conductively coupled between the die and the substrate.

6. The method of claim 5, wherein the wire bonds are positioned on four sides of the substrate.

7. The method of claim 5, wherein the area circumscribed by the panel dam is filled with the insulating polymer to a level below a top edge of the die of each integrated optical circuit in the array of integrated optical circuits.

8. The method of claim 5, wherein the insulating polymer is on four sides of the die of each integrated optical circuit in the array of integrated optical circuits.

9. The method of claim 1, wherein the securing includes forming the panel dam around the periphery of the array of integrated optical circuits.

10. A method for manufacturing a device, the method comprising:
    securing a panel dam on a substrate around a periphery of an array of integrated optical circuits, wherein the integrated optical circuits comprise aperture windows;
    filling an area circumscribed by the panel dam with an insulating polymer to a level below a top edge of the aperture windows, the insulating polymer on four sides of the aperture windows, exposing top surfaces of the aperture windows; and
    singulating an integrated optical circuit of the array of integrated optical circuits.

11. The method of claim 10, further comprising heating the insulating polymer prior to the singulating, to form a skin on an outer surface of the insulating polymer.

12. The method of claim 10, wherein the singulating includes:
    etching the insulating polymer near a periphery of the integrated optical circuit in the array of integrated optical circuits;
    forming scribe lines in the substrate, wherein the scribe lines are formed near the periphery of the integrated optical circuits of the array of integrated optical circuits; and applying a force to break the substrate along the scribe lines.

13. The method of claim 10, wherein the singulating includes:
sawing through the insulating polymer and the substrate near a periphery of each integrated optical circuit in the array of integrated optical circuits.

14. The method of claim 10, wherein the singulating includes:
lasing through the insulating polymer and the substrate near a periphery of each integrated optical circuit in the array of integrated optical circuits.

15. The method of claim 10, wherein the integrated optical circuit comprises:
a die on the substrate;
an optical circuit embedded in the die; and
an aperture window of the aperture windows on the optical circuit.

16. The method of claim 15, wherein the integrated optical circuit comprises a mirror array on the optical circuit below the aperture window.

17. The method of claim 15, wherein the integrated optical circuit further comprises wire bonds conductively coupling the die and the substrate.

18. The method of claim 10, wherein the insulating polymer comprises epoxy or silicone.

19. The method of claim 10, wherein the substrate comprises ceramic.

20. The method of claim 10, wherein securing the panel dam comprises using downward force to attach the panel dam to the substrate.

* * * * *